United States Patent [19]
Vorenkamp

[11] Patent Number: 5,869,993
[45] Date of Patent: Feb. 9, 1999

[54] DISTORTION COMPENSATION FOR A CAPACITIVELY LOADED FOLLOWER

[75] Inventor: Pieter Vorenkamp, Eindhoven, Netherlands

[73] Assignee: U.S. Philips Corporation, New York, N.Y.

[21] Appl. No.: 791,121

[22] Filed: Jan. 30, 1997

[30] Foreign Application Priority Data

Feb. 1, 1996 [EP] European Pat. Off. ............ 96200219

[51] Int. Cl.[6] .................................................. H03K 5/08
[52] U.S. Cl. .......................................... 327/317; 327/362
[58] Field of Search .................................. 327/51, 52, 55, 327/84, 96, 427, 432, 434, 437, 478, 480–484, 491, 541, 543, 577, 581, 119, 362, 313, 317, 328, 333, 291; 330/9

[56] References Cited

U.S. PATENT DOCUMENTS

| | | | |
|---|---|---|---|
| 4,523,110 | 6/1985 | Johnson | 327/55 |
| 5,339,078 | 8/1994 | Vernon | 327/427 |
| 5,345,120 | 9/1994 | Taylor | 327/55 |
| 5,414,382 | 5/1995 | Larson et al. | 327/427 |
| 5,436,581 | 7/1995 | Oberhauser | 327/427 |
| 5,656,969 | 8/1997 | Pulvirenti et al. | 327/427 |

*Primary Examiner*—My-Trang Nu Ton
*Attorney, Agent, or Firm*—Leroy Eason

[57] ABSTRACT

The odd harmonic distortion components in the output signal of a capacitively loaded follower transistor is reduced by means of an additional transistor inserted between the emitter of the follower transistor and the bias current source of the follower transistor. A second follower transistor receives the same input signal as the follower transistor and has its emitter coupled to the emitter of the additional transistor via a compensation capacitor. The current through the compensation capacitor is added to the output current and compensates for the odd harmonic distortion.

4 Claims, 2 Drawing Sheets

DISTORTION COMPENSATION FOR A CAPACITIVELY LOADED FOLLOWER

BACKGROUND OF THE INVENTION

1. Field of the Invention

The invention relates to a transistor circuit comprising an input terminal for receiving an input signal, an output terminal for providing a buffered output signal in response to the input signal, a first transistor having a control electrode coupled to the input terminal, a first main electrode coupled to the output terminal and a second main electrode, and a first bias current means coupled to the first main electrode for supplying a first bias current to the first transistor.

2. Description of the Related Art

Such a transistor circuit is the well known follower and is widely used as a buffer for driving capacitive loads. For example in sampling circuits, e.g. Track and Hold Circuits or Sample and Hold Circuits, where the signal is stored in a capacitor, some drive capacity is required in order to store the input signal with sufficient accuracy at the desired signal speed. A very basic circuit for this purpose is the follower. A bipolar implementation of the follower including the capacitive load is shown in FIG. 1. Due to the non-linear voltage-to-current transfer characteristics of a transistor the output signal across the capacitive load can be expressed as a level shifted version of the input signal plus a series of even harmonic distortion terms and a series of odd harmonic distortion terms. Using a differential circuit topology the even harmonic distortion terms can be suppressed and theoretically be eliminated supposing ideal matching between the duplicated circuit parts. However, the odd harmonic distortion terms cannot be suppressed in this way.

SUMMARY OF THE INVENTION

Therefore, it is an object of the present invention to provide a follower with compensation for odd harmonic distortion. For this purpose the transistor circuit as specified in the opening paragraph is characterized in that the transistor circuit further comprises a second transistor and a third transistor, a second bias current means and a compensation capacitor, a control electrode of the second transistor being coupled to the input terminal, the second bias current means being coupled to a first main electrode of the second transistor for supplying a second bias current to the second transistor, the third transistor having a first main electrode coupled to the first bias current means, a second main electrode coupled to the first main electrode of the first transistor and a control electrode coupled to receive a bias voltage.

Since the control electrode of the second transistor receives the same input signal as the first transistor, a current with similar distortion components flows in the compensation capacitor, which current is added to the output current via the main current path of the third transistor. This compensation scheme is applicable to bipolar and unipolar transistors.

In order to reduce not only the odd harmonic distortion but also the even harmonic distortion an embodiment of the transistor circuit according to the invention is characterized in that the transistor circuit further comprises a further input terminal, a further output terminal and a fourth transistor, the fourth transistor having a control electrode coupled to the further input terminal and first main electrode coupled to the further output terminal and to a second main electrode of the second transistor.

This embodiment is fully balanced and has a differential topology with minimal power consumption because the current through the second transistor also flows through the fourth transistor. Depending on the transistor technology, particularly for bipolar transistors, this embodiment may be further characterized in that the control electrode of the second transistor is coupled to the input terminal via a first level shifting circuit and the control electrode of the third transistor is coupled to the further input terminal via a second level shifting circuit.

The level shifting circuits provide proper bias and/or extra signal excursion range for the transistors. A useful and simple implementation of the level shifting circuits is provided in a further embodiment of the transistor circuit according to the invention which is characterized in that the first level shifting circuit comprises a fifth transistor and a third bias current means, the fifth transistor having a control electrode coupled to the input terminal and a first main electrode coupled to the control electrode of the second transistor, the third bias current means being coupled to the first main electrode of the fifth transistor for supplying a third bias current to the fifth transistor, and the second level shifting circuit comprises a sixth transistor and a fourth bias current means, the sixth transistor having a control electrode coupled to the further input terminal and a first main electrode coupled to the control electrode of the third transistor, the fourth bias current means being coupled to the first main electrode of the sixth transistor for supplying a fourth bias current to the sixth transistor.

BRIEF DISCUSSION OF THE DRAWING

The above and other features and advantages of the invention will be apparent from the following description of exemplary embodiments of the invention with reference to the accompanying drawings, in which.

Like reference symbols are employed in the drawings and in the description of the preferred embodiments to represent the same or very similar item or items.

DETAILED DESCRIPTION OF THE PREFERRED EMBODIMENTS OF THE INVENTION

Figure 1:
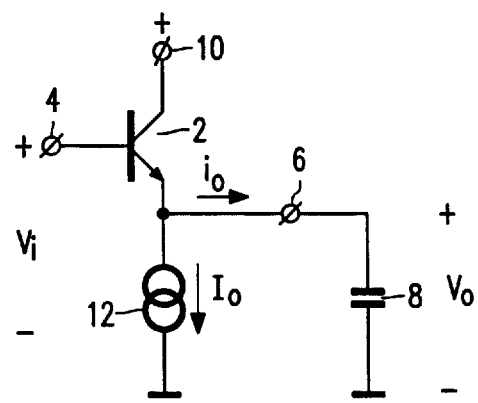
FIG. 1 shows a conventional bipolar follower circuit.

FIG. 1 shows a bipolar implementation of a capacitively loaded conventional follower circuit. The circuit comprises an NPN transistor 2 in emitter-follower configuration. The control electrode or base of the transistor 2 is coupled to an input terminal 4 and receives an input signal $v_i$ supplied to the input terminal 4. The first main electrode or emitter of transistor 2 is coupled to an output terminal 6 which is loaded with a load capacitor 8. The second main electrode or collector of transistor 2 is coupled to a source of positive supply voltage 10. A bias current source 12 is coupled between the emitter of transistor 2 and ground and supplies a bias current $I_0$ to transistor 2. The output signal $v_o$ across the load capacitor 8 can be expressed as a function of the input signal $v_i$ and a modulation index $m_1$ of the emitter follower bias current $I_0$:

$$v_o = v_i - V_{be} = v_i - V_{BEO} - V_T \ln(1+m_1) \quad (1)$$

In this expression $m_1$ is defined as $i_o/I_0$, $i_o$ being the signal current flowing into the load capacitor 8; $V_{be}$ is the base-emitter voltage of transistor 2; $V_{BEO}$ is the steady state portion of $V_{be}$ and $V_T$ is the well known thermal voltage kT/q. The non-linear term $V_T \ln(1+m_1)$ present in equation (1) can be written as:

$$V_T \ln(1+m_1) = V_T \left( m_1 - \frac{m_1^2}{2} + \frac{m_1^3}{3} - \frac{m_1^4}{4} + \frac{m_1^5}{5} - \ldots \right) \quad (2)$$

Figure 2:
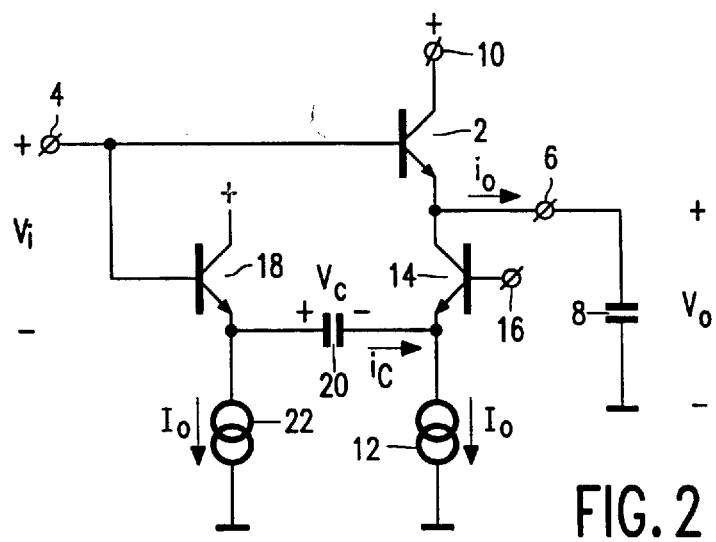
FIG. 2 shows a bipolar implementation of a follower circuit according to the invention.

The output signal $v_o$ can accordingly be written as a DC shifted version of the input signal $v_i$ plus a series of even harmonics and a series of odd harmonics. The even harmonics can be suppressed by using a differential or balanced topology, but the odd harmonics still remain present in the output signal. FIG. 2 shows a follower according to the invention in which a capacitive compensation technique is used to suppress the odd harmonics in the output signal of the follower of FIG. 1. For this purpose an NPN transistor 14 is inserted between the emitter of transistor 2 and bias current source 12. The emitter, collector and base of transistor 14 are coupled to, respectively, the bias current source 12, the emitter of transistor 2 and a terminal 16 for connecting a bias voltage source. The circuit further comprises an NPN transistor 18, just like transistor 2 operating in emitter-follower configuration. The base of transistor 18 is coupled to the input terminal 4 and receives the input signal $v_i$ supplied to the input terminal 4 in a fashion similar to transistor 2. The emitter of transistor 18 is coupled to the emitter of transistor 14 via a compensation capacitor 20. The collector of transistor 18 is coupled to the source of positive supply voltage 10. A bias current source 22, similar to bias current source 12, is coupled between the emitter of transistor 18 and ground and supplies a bias current $I_0$ to transistor 18.

The purpose of the transistors 14 and 18 and the compensation capacitor 20 is to supply the emitter follower transistor 2 with a bias current which compensates for the current causing the odd harmonic components in the output signal $v_o$. The voltage $v_C$ across the compensation capacitor 20 can be expressed as a function of the input signal $v_i$ and the modulation index $m_2$ of the transistors 14 and 18:

$$v_C = v_i - \Delta V_{be} = v_i - V_T \ln\left(\frac{1+m_2}{1-m_2}\right) \quad (3)$$

In this expression $m_2$ is defined as $i_C/I_0$, $i_C$ being the signal current flowing through the compensation capacitor 20; $v_C$ is the signal voltage across the compensation capacitor 20; and $\Delta V_{be}$ is the difference between the base-emitter voltages of the transistors 18 and 14. The non-linear term in the signal $v_C$ can be written as:

$$V_T \ln\left(\frac{1+m_2}{1-m_2}\right) = 2V_T \left( m_2 + \frac{m_2^3}{3} + \frac{m_2^5}{5} + \ldots \right) \quad (4)$$

The voltage $v_C$ across the compensation capacitor 20 thus equals a shifted version of the input voltage $v_i$ plus a series of odd harmonic terms. At equal modulation indices ($m_1 = m_2$) the magnitude of the odd harmonic terms in signal current $i_C$ equals twice the magnitude of the odd harmonics in signal current $i_o$ generated by the emitter follower transistor 2 if the capacitance $C_C$ of the compensation capacitor 20 and the capacitance $C_L$ of the load capacitor 8 are equal. As a result the odd harmonics will cancel when the current $i_C$ flowing through the compensation capacitor 20 equals half the current $i_o$ through the load capacitor 8. Cancellation of the odd harmonics is obtained at a capacitor ratio $C_C/C_L = 0.5$.

It is to be noted that the same effect can be obtained with other capacitor ratios by scaling the emitter areas of the transistors 14 and/or 18 in respect of the emitter area of transistor 2, and/or by selecting different bias currents for the bias current sources 12 and 22. It is further noted that a reduction of odd harmonics is also effected if the cancellation is not perfect, for instance due to small mismatches between the transistors, parasitic capacitances, etc.

Figure 3:
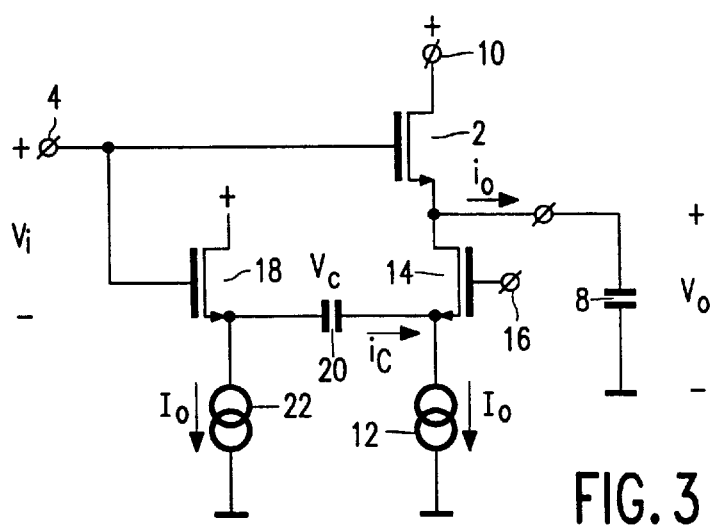
FIG. 3 shows a unipolar implementation of a follower circuit according to the invention.

Instead of bipolar transistors transistors of other technologies may be used as shown in FIG. 3. In case of unipolar (MOSFET) transistors the control electrode, first main electrode and second main electrode of a transistor correspond to, respectively, the gate, source and drain of a unipolar transistor. The general theory of the compensation scheme is applicable as well, but the equations (1) to (4) should be adapted to the specific characteristics of the transistors.

If so desired the bias current sources can be replaced with resistors or any other biassing means, although this might be accompanied with a reduced cancellation of odd harmonics.

Figure 4:
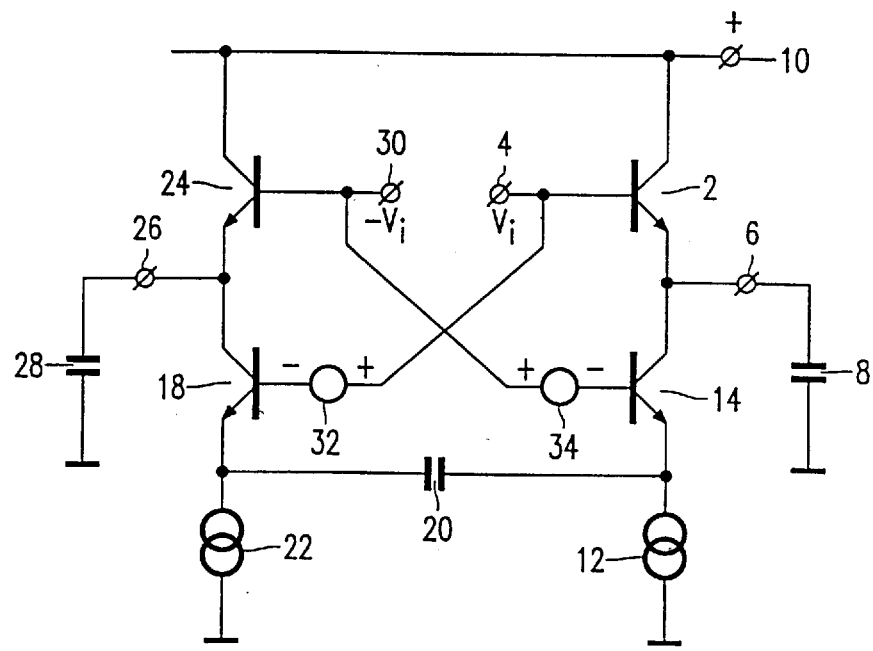
FIG. 4 shows a differential bipolar implementation of a follower circuit according to the invention.

FIG. 4 shows a differential or balanced version of the bipolar implementation of the follower according to the invention. This version has differential input and differential output terminals and provides a differential output signal with reduced even and odd harmonic distortion. The collector of transistor 18 is coupled to the emitter of an NPN transistor 24, the collector of which is coupled to the source of positive supply voltage 10. The emitter of transistor 24 is coupled to a further output terminal 26 which is loaded with a further load capacitor 28. The base of transistor 24 is coupled to a further input terminal 30 and receives a complementary input signal $-v_i$. The base of transistor 18 is coupled to the input terminal 4 via a first level shifting circuit 32, and the base of transistor 14 is coupled to the further input terminal 30 via a second level shifting circuit 34. This arrangement implies that the further input terminal 30 replaces the terminal 16 shown in FIG. 2 and provides both a bias voltage and a complementary input voltage to the base of transistor 14. The level shifting circuits 32 and 34 provide proper bias for the transistors, but may be omitted if the transistor technology allows this.

Figure 5:
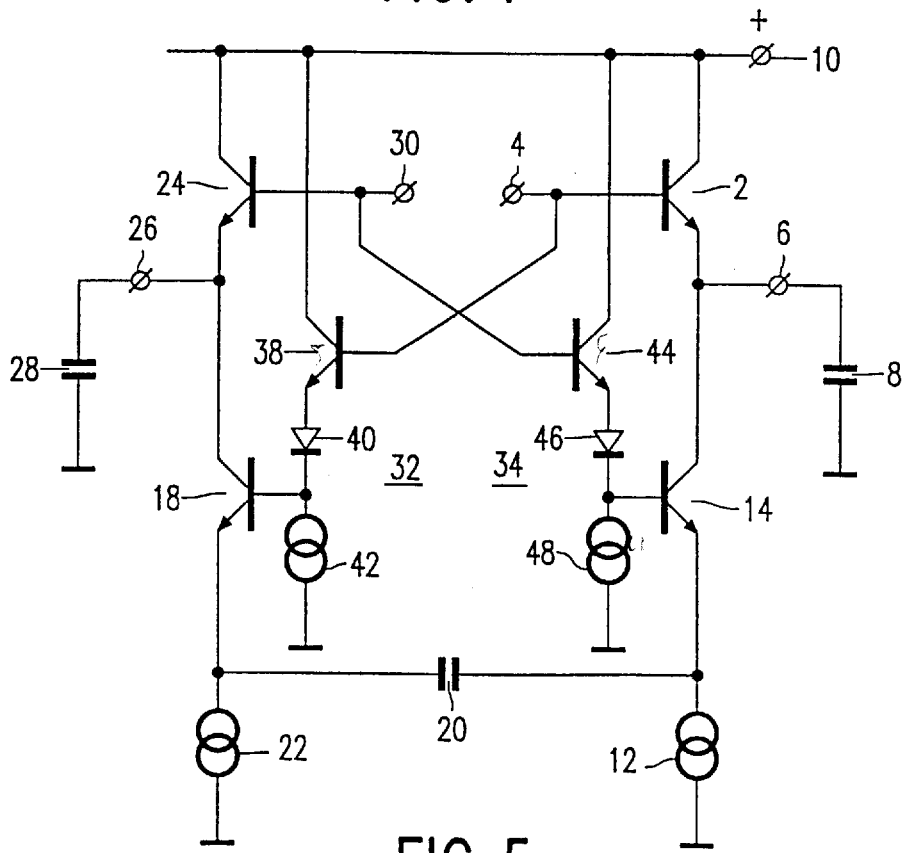
FIG. 5 shows a differential bipolar implementation of a follower circuit according to the invention.

FIG. 5 shows a bipolar differential version in which the level shifting circuits are presented in more detail. The first level shifting circuit 32 comprises an emitter follower transistor 38, which has the base coupled to the input terminal 4, the collector coupled to the source of positive supply voltage 10 and the emitter coupled to the base of transistor 18 via an optional diode 40. A bias current source 42 is coupled to the emitter of transistor 38 via the optional diode 40. Similarly, the second level shifting circuit 34 comprises an emitter follower transistor 44, which has the base coupled to the further input terminal 30, the collector coupled to the source of positive supply voltage 10 and the emitter coupled to the base of transistor 14 via an optional diode 46 and a bias current source 48 is coupled to the emitter of transistor 4 via the optional diode 46. The diodes 40 and 46 provide more collector signal range to the transistors 14 and 18, but may be omitted if such range is not needed. The level shifting transistors 38 and 44 hardly introduce extra distortion because these transistors are not capacitively loaded.

The circuits shown in FIGS. 2 to 5 are suitable for use as a single ended or differential buffer for driving capacitive loads, for example in sampling circuits, e.g. Track and Hold Circuits or Sample and Hold Circuits, line drivers, etc.

As already demonstrated in FIG. 3, the circuits may be implemented in any transistor technology, for instance in bipolar or MOS technology. The transistors shown may also be compound transistors, such as Darlington transistors or NPN/PNP combinations or compound transistors of mixed technology. In this respect the transistors 18 and 38 and the transistors 44 and 14 in the circuit of FIG. 5 can be considered as compound transistors as well and be replaced by compound transistors, if desired.

Also transistors of reversed conductivity may be used. In that case the polarity of the supply voltage should be reversed as well.

I claim:

1. A transistor follower circuit which provides capacitive compensation for harmonic distortion of a capacitive load voltage; said circuit comprising:

a first input terminal (4) for receiving an input signal and a first output terminal (6) for connection to a capacitive load across which an output signal is produced by said circuit in response to the input signal;

a first transistor (2) having a control electrode coupled to the first input terminal (4) and a first main electrode coupled to the first output terminal (6); and a first bias current means (12) coupled to the first main electrode of said first transistor (2) for supplying a first bias current to said first transistor (2);

characterized in that said circuit further comprises:

a second transistor (18) having a first main electrode coupled to a second bias current means (22) for supplying a second bias current to the second transistor (18), a control electrode of the second transistor (18) being coupled to the first input terminal (4);

a third transistor (14) having a first main electrode coupled to the first bias current means (12), a second main electrode coupled to the first main electrode of the first transistor (2), and a control electrode coupled to a source of bias voltage; and a compensation capacitor (20) coupled between the first main electrode of the second transistor (18) and the first main electrode of the third transistor (14).

2. A transistor follower circuit as claimed in claim 1, further comprising a second input terminal (30) and a second output terminal (26), and a fourth transistor (24) having a control electrode coupled to the second input terminal (30) and a first main electrode which is coupled to the second output terminal (26) and further coupled to a second main electrode of the second transistor (18).

3. A transistor follower circuit as claimed in claim 2, wherein the control electrode of the second transistor (18) is coupled to the first input terminal (4) via a first level shifting circuit (32) and the control electrode of the third transistor (14) is coupled to the second input terminal (30) via a second level shifting circuit (34).

4. A transistor follower circuit as claimed in claim 3, wherein the first level shifting circuit (32) comprises a fifth transistor (38) and a third bias current means (42), the fifth transistor (38) having a control electrode coupled to the first input terminal (4) and a first main electrode coupled to the control electrode of the second transistor (18), the third bias current means (42) being coupled to the first main electrode of the fifth transistor (38) for supplying a third bias current to the fifth transistor (38), and the second level shifting circuit (34) comprises a sixth transistor (44) and a fourth bias current means (48), the sixth transistor (44) having a control electrode coupled to the second input terminal (30) and a first main electrode coupled to the control electrode of the third transistor (14), the fourth bias current means (48) being coupled to the first main electrode of the sixth transistor (44) for supplying a fourth bias current to the sixth transistor (44).

* * * * *